United States Patent
Takahashi et al.

(10) Patent No.: US 9,461,230 B2
(45) Date of Patent: Oct. 4, 2016

(54) THERMOELECTRIC CONVERSION MATERIAL, THERMOELECTRIC CONVERSION ELEMENT AND ARTICLE FOR THERMOELECTRIC POWER GENERATION USING SAME, AND METHOD FOR MANUFACTURING THERMOELECTRIC CONVERSION ELEMENT

(71) Applicant: FUJIFILM Corporation, Tokyo (JP)

(72) Inventors: Eri Takahashi, Kanagawa (JP); Yoichi Maruyama, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 104 days.

(21) Appl. No.: 14/564,351

(22) Filed: Dec. 9, 2014

(65) Prior Publication Data

US 2015/0096604 A1    Apr. 9, 2015

Related U.S. Application Data

(63) Continuation of application No. PCT/JP2013/068036, filed on Jul. 1, 2013.

(30) Foreign Application Priority Data

Jul. 11, 2012  (JP) .................. 2012-155984
Jun. 25, 2013  (JP) .................. 2013-132805

(51) Int. Cl.
| | |
|---|---|
| *H01L 35/24* | (2006.01) |
| *H01L 35/22* | (2006.01) |
| *H01L 35/34* | (2006.01) |
| *C08G 61/12* | (2006.01) |
| *C08L 65/00* | (2006.01) |
| *C08K 7/00* | (2006.01) |
| *H01L 35/32* | (2006.01) |
| *C08K 3/04* | (2006.01) |
| *H01L 35/26* | (2006.01) |
| *B82Y 30/00* | (2011.01) |

(52) U.S. Cl.
CPC .............. *H01L 35/32* (2013.01); *C08K 3/04* (2013.01); *H01L 35/22* (2013.01); *H01L 35/24* (2013.01); *H01L 35/26* (2013.01); *H01L 35/34* (2013.01); *B82Y 30/00* (2013.01); *C08G 2261/55* (2013.01); *C08K 2201/011* (2013.01); *C08L 65/00* (2013.01); *Y10S 977/783* (2013.01); *Y10S 977/948* (2013.01)

(58) Field of Classification Search
CPC ....... H01L 35/24; H01L 35/22; H01L 35/34; H01L 35/32; C08G 2261/55; C08G 2261/3223; C08G 61/126; C08K 3/04; Y10S 977/753; Y10S 977/833
See application file for complete search history.

(56) References Cited

U.S. PATENT DOCUMENTS

| | | | |
|---|---|---|---|
| 2010/0319750 A1 | 12/2010 | Meng et al. | |
| 2014/0251407 A1* | 9/2014 | Nishio | .............. H01L 35/24 136/239 |

FOREIGN PATENT DOCUMENTS

| | | |
|---|---|---|
| JP | 2004-87714 A | 3/2004 |
| JP | 2008-305831 A | 12/2008 |
| JP | 2010-199276 A | 9/2010 |

OTHER PUBLICATIONS abstract for JP 2012-119657, Jun. 21, 2012.*
International Search Report for PCT/JP2013/068036 dated Sep. 17, 2013, 2 pages in English.
International Preliminary Report on Patentability and Written Opinion, dated Jan. 13, 2015, issued in corresponding International Application No. PCT/JP2013/068036, 8 pages in English and Japanese.

* cited by examiner

*Primary Examiner* — Carol M Koslow
(74) *Attorney, Agent, or Firm* — Sughrue Mion, PLLC

(57) ABSTRACT

The present invention relates to a thermoelectric conversion material including a carbon nanotube, a thermoelectric conversion element including the same, an article for thermoelectric power generation, and a method for manufacturing the thermoelectric conversion element. The thermoelectric conversion material comprising: a carbon nanotube; and a polythiophene polymer constituted of a repeating unit represented by the following formula (1),

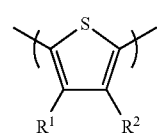

Formula (1)

in Formula (1), each of $R^1$ and $R^2$ independently represents an alkyl group having 1 to 20 carbon atoms.

20 Claims, 2 Drawing Sheets

THERMOELECTRIC CONVERSION MATERIAL, THERMOELECTRIC CONVERSION ELEMENT AND ARTICLE FOR THERMOELECTRIC POWER GENERATION USING SAME, AND METHOD FOR MANUFACTURING THERMOELECTRIC CONVERSION ELEMENT

CROSS-REFERENCE TO RELATED APPLICATIONS

This application is a Continuation of PCT International Application No. PCT/JP2013/068036, filed on Jul. 1, 2013, which claims priority under 35 U.S.C. §119(a) to Japanese Patent Application No. 2012-155984, filed on Jul. 11, 2012, and to Japanese Patent Application No. 2013-132805, filed on Jun. 25, 2013. Each of the above application(s) is hereby expressly incorporated by reference, in its entirety, into the present application.

BACKGROUND OF INVENTION

1. Field of the Invention

The present invention relates to a thermoelectric conversion material including a carbon nanotube, a thermoelectric conversion element including the material, and an article for thermoelectric power generation including the same element. In addition, the present invention relates to a method for manufacturing the thermoelectric conversion element.

2. Description of the Related Art

In recent years, in consideration of the global environment, there has been a demand for the transition of fossil energies of the related art into renewable energies. Examples of the renewable energies include solar power generation, wind power generation, wave power generation, vibration power generation, thermoelectric power generation, and the like. However, among the above-described power generations, the thermoelectric power generation is attracting attention since the thermoelectric power generation is capable of directly converting thermal energy into electric power, and is capable of effectively using a huge quantity of unused thermal energy such as exhaust heat from solar power generation, geothermal power generation, hot water heat power generation, an industrial furnace or a vehicle. In addition, the thermoelectric power generation is capable of directly converting thermal energy into electric power, and does not require a movable unit, and thus has been put into practical use of a wrist watch which is operated by using body heat, a power supply in a remote area, a power supply in the space, and the like.

For the thermoelectric power generation, a thermoelectric conversion material capable of converting thermal energy into electric energy and vice versa, and a thermoelectric conversion element (thermoelectric power generation element) produced by processing the thermoelectric conversion material are used. From the viewpoint of the thermoelectric conversion efficiency, the thermoelectric conversion material that has been put into practical use at the moment is an inorganic material, but the inorganic material has problems of a high price, the inclusion of a harmful substance, the complicated step of being processed into a thermoelectric conversion element, and the like. Therefore, studies are underway regarding an organic thermoelectric conversion material that can be manufactured at a relatively low cost, and can be easily formed into a film. For example, US2010/0319750A and JP2008-305831A report thermoelectric conversion materials for which a carbon nanotube is used.

SUMMARY OF INVENTION

An object of the present invention is to provide a thermoelectric conversion material having excellent thermoelectric performance, a thermoelectric conversion element including the same material, an article for thermoelectric power generation including the same element, and a method for manufacturing the thermoelectric conversion element.

The present inventors, additionally, have conducted intensive studies regarding an organic thermoelectric conversion material. As a result, it has been found that a composition including a carbon nanotube and a polythiophene polymer in which both the third and fourth positions of a thiophene ring are substituted by alkyl groups exhibits excellent thermoelectric performance, and is useful as a thermoelectric conversion material. The material had a strong electric conduction property and a high thermoelectric force required for thermoelectric conversion, and exhibited excellent thermoelectric performance. The present invention has been completed on the basis of the above-described finding.

That is, the above-described object is achieved by the following thermoelectric conversion material, thermoelectric conversion element, article for thermoelectric power generation, and method for manufacturing the thermoelectric conversion element.

<1> A thermoelectric conversion material including a carbon nanotube and a polythiophene polymer constituted of a repeating unit represented by the following formula (1),

[Chem. 1]

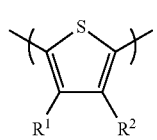

Formula (1)

In Formula (1), each of $R^1$ and $R^2$ independently represents an alkyl group having 1 to 20 carbon atoms.

<2> The thermoelectric conversion material according to <1> in which, in Formula (1), $R^2$ is an alkyl group having 4 to 12 carbon atoms.

<3> The thermoelectric conversion material according to <1> or <2> in which, in Formula (1), $R^1$ is an alkyl group having 1 to 4 carbon atoms.

<4> The thermoelectric conversion material according to any one of <1> to <3> in which, in Formula (1), $R^2$ is a branched alkyl group having 4 to 12 carbon atoms.

<5> The thermoelectric conversion material according to any one of <1> to <4> in which, in Formula (1), $R^1$ is a straight alkyl group having 1 to 3 carbon atoms.

<6> The thermoelectric conversion material according to any one of <1> to <5> in which, in Formula (1), $R^2$ is a 2-methyl hexyl group, a 2-ethyl hexyl group, a 2-methyloctyl group, or a 2-ethyloctyl group.

<7> The thermoelectric conversion material according to any one of <1> to <6> in which, in Formula (1), $R^2$ is a 2-ethyl hexyl group.

<8> The thermoelectric conversion material according to any one of <1> to <7> in which, in Formula (1), $R^1$ is a methyl group.

<9> The thermoelectric conversion material according to any one of <1> to <8> in which, in a total solid content of the thermoelectric conversion material, 2 mass % to 60 mass % of the carbon nanotube and 20 mass % to 80 mass % of the polythiophene polymer are included.

<10> The thermoelectric conversion material according to any one of <1> to <9> further including a non-conjugated macromolecule.

<11> The thermoelectric conversion material according to any one of <1> to <10> further including a solvent.

<12> A thermoelectric conversion element in which the thermoelectric conversion material according to any one of <1> to <11> is used for a thermoelectric conversion layer.

<13> The thermoelectric conversion element according to <12> in which the thermoelectric conversion layer is formed using an ink jet printing method.

<14> The thermoelectric conversion element according to <12> or <13> including a base material and a thermoelectric conversion layer provided on the base material.

<15> The thermoelectric conversion element according to any one of <12> to <14> further including an electrode.

<16> An article for thermoelectric power generation in which the thermoelectric conversion element according to any one of <12> to <15> is used.

<17> A method for manufacturing a thermoelectric conversion element including a step of providing a thermoelectric conversion layer by printing the thermoelectric conversion material according to any one of <1> to <11> on a base material using an ink jet printing method.

In the present invention, a numerical value range represented using "to" indicates a range including the numerical values before and after the "to" as the lower limit value and the upper limit value.

In addition, when a substituent is referred to as an xxx group in the present invention, the present invention may have an arbitrary substituent in the xxx group. In addition, in a case in which a plurality of groups is indicated using the same reference signs, the groups may be mutually identical or different.

The thermoelectric conversion material of the present invention has a strong electric conduction property and a thermoelectric force required for thermoelectric conversion, and has excellent thermoelectric performance. The thermoelectric conversion material can be preferably used for thermoelectric conversion usages such as a thermoelectric conversion element or an article for thermoelectric power generation.

In addition, according to the manufacturing method of the present invention, it is possible to manufacture a thermoelectric conversion element having high thermoelectric performance.

DESCRIPTION OF THE PREFERRED EMBODIMENTS

[Thermoelectric Conversion Material]

Figure 1:
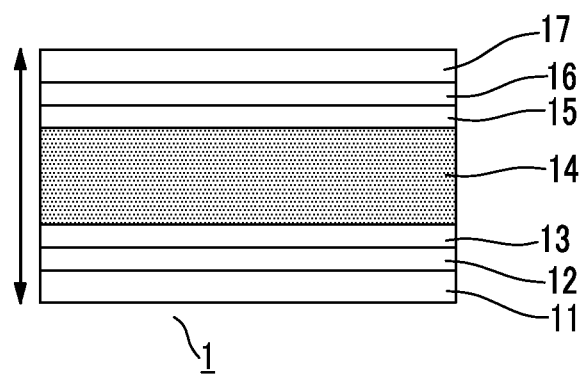
FIG. 1 is a view schematically illustrating an example of a thermoelectric conversion element of the present invention. The arrow in FIG. 1 indicates the direction of a temperature difference imparted during the use of the element.

The thermoelectric performance of the thermoelectric conversion material or the thermoelectric conversion element can be measured using a performance index ZT represented using the following equation (A). As is clear from the following equation (A), the improvement of the thermoelectric performance requires an increase in the thermoelectric force and the electric conductivity and a decrease in the thermal conductivity. As described above, since the thermoelectric performance is significantly affected by factors other than the electric conductivity, it is not certain whether or not a material generally having a high electric conductivity effectively functions as a thermoelectric conversion material in actual cases. The thermoelectric conversion material of the present invention is capable of realizing a high electric conductivity without decreasing the thermoelectric force as verified in examples described below, and has thermoelectric performance favorable enough to be used as a thermoelectric conversion material.

Performance index $ZT = S^2 \cdot \sigma \cdot T / \kappa$ (A)

$S(V/K)$: Thermoelectric force (Seebeck coefficient)

$\sigma(S/m)$: Electric conductivity $\kappa(W/mK)$: Thermal conductivity $T(K)$: Absolute temperature The thermoelectric conversion material of the present invention includes a carbon nanotube and a polythiophene polymer constituted of a repeating unit represented by Formula (1) described below. Hereinafter, the respective components of the thermoelectric conversion material of the present invention will be described.

[Carbon Nanotube]

Examples of the carbon nanotube (hereinafter, also referred to as CNT) include a single-layer CNT around which a carbon film (graphene sheet) is cylindrically coiled, a dual-layer CNT around which two graphene sheets are concentrically coiled, and a multi-layer CNT around which multiple graphene sheets are concentrically coiled. In the present invention, the single-layer CNT, the dual-layer CNT, and the multi-layer CNT may be singly used, or two or more CNTs may be jointly used. In particular, it is preferable to use the single-layer CNT and the dual-layer CNT which have excellent electric conductivity and semiconductor characteristics, and the single-layer CNT is more preferably used.

The single-layer CNT may be a semi-conductive CNT or a metallic CNT, or may be a combination of a semi-conductive CNT and a metallic CNT. In addition, the CNT may include metal or the like, or may include a molecule such as fullerene. Meanwhile, the thermoelectric conversion material of the present invention may include, in addition to the CNT, nanocarbons such as carbon nanohorns, carbon nanocoils, or carbon nanobeads.

The CNT can be manufactured using an arc discharge method, a chemical vapor deposition method (hereinafter, referred to as the CVD method), a laser abrasion method, or the like. The CNT used in the present invention may be a CNT obtained using any method, but is preferably a CNT obtained using the arc discharge method and the CVD method.

When the CNT is manufactured, fullerene, graphite, or amorphous carbon is generated as a by-product at the same time, and catalyst metals such as nickel, iron, cobalt, and yttrium also remain. To remove these impurities, it is preferable to purify the CNT. There is no particular limitation regarding the method for purifying the CNT, but an acid treatment using nitric acid, sulfuric acid, or the like or an ultrasonic treatment is effective for removing the impurities. It is more preferable to remove the impurities by separation using a filter in conjunction with the above-described treatment from the viewpoint of improving the purity.

After the purification, the obtained CNT can be used with no additional step. In addition, generally, the CNT is generated in a string shape, the CNT may be used after being cut into a desired length depending on usage. The CNT can be cut into a short fiber shape using an acid treatment in which nitric acid, sulfuric acid, or the like is used, an ultrasonic treatment, a frost shattering method, or the like. In addition, it is preferable to carry out separation using a filter in conjunction with the above-described treatment from the viewpoint of improving the purity.

In the present invention, not only the cut CNT but also the CNT that has been produced in a short fiber shape in advance can be used. The above-described short fiber-shaped CNT is obtained in a shape of being oriented in the vertical direction to the substrate surface by, for example, forming catalyst metals such as iron and cobalt on a substrate, and thermally decomposing a carbon compound on the substrate surface at 700° C. to 900° C. using the CVD method, thereby causing the vapor deposition of the CNT. The short fiber-shaped CNT produced in the above-described manner can be taken out from the substrate using a method such as peeling. In addition, the short fiber-shaped CNT can also be grown on the surface of a catalyst metal using the CVD method after the catalyst metal is supported on a porous supporting body such as porous silicon or on an anodically-oxidized film of alumina. The oriented short fiber-shaped CNT can be produced using a method in which molecules such as iron phthalocyanine containing a catalyst metal in the molecules is used as a raw material, and CVD is carried out in a gas flow of argon/hydrogen, thereby producing the CNT on the substrate. Furthermore, it is also possible to obtain the oriented short fiber-shaped CNT on the surface of a SiC monocrystal using an epitaxial growth method.

The average length of the CNT used in the present invention is not particularly limited; however, from the viewpoint of manufacturing readiness, film-forming properties, electric conduction properties, and the like, the average length of the CNT is preferably in a range of 0.01 µm to 1000 µm, and more preferably in a range of 0.1 µm to 100 µm.

The diameter of the CNT used in the present invention is not particularly limited; however, from the viewpoint of durability, transparency, film-forming properties, electric conduction properties, and the like, the diameter of the CNT is preferably in a range of 0.4 nm to 100 nm, more preferably 50 nm or less, and still more preferably 15 nm or less.

The content of the CNT in the thermoelectric conversion material is, in the total solid content, preferably in a range of 2 mass % to 60 mass %, more preferably in a range of 5 mass % to 40 mass %, and particularly preferably in a range of 8 mass % to 30 mass %.

[Polythiophene Polymer]

The polythiophene polymer used in the thermoelectric conversion material of the present invention has an alkyl-substituted thiophene structure represented by the following formula (1) as a repeating unit. The polythiophene polymer has a molecular structure including a conjugated polymer main chain by forming a polymer main chain coupled at the second and fifth positions of a thiophene ring, and thus functions as an electrically conductive macromolecule.

[Chem. 2]

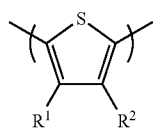

Formula (1)

In Formula (1), each of $R^1$ and $R^2$ independently represents an alkyl group having 1 to 20 carbon atoms.

The alkyl group of $R^1$ or $R^2$ may be either a straight alkyl group or a branched alkyl group. Specific examples of the straight alkyl group include a methyl group, an ethyl group, a propyl group, a butyl group, a pentyl group, a hexyl group, a heptyl group, an octyl group, a nonyl group, a decyl group, a undecyl group, a dodecyl group, a tridecyl group, a tetradecyl group, a pentadecyl group, a hexadecyl group, a heptadecyl group, an octadecyl group, a nonadecyl group, and an eicosyl group, and specific examples of the branched alkyl group include an isopropyl group, an isobutyl group, an isoamyl group, a s-butyl group, a t-butyl group, a 2-methyl butyl group, a 2-methyl hexyl group, a 2-ethyl hexyl group, a 2-methyl octyl group, a 2-ethyl octyl group, and the like. The alkyl group may further include a substituent, but is preferably an unsubstituted alkyl group.

$R^1$ is preferably an alkyl group having 1 to 4 carbon atoms, more preferably a straight alkyl group having 1 to 3 carbon atoms, and particularly preferably a methyl group.

$R^2$ is preferably an alkyl group having 4 to 12 carbon atoms, more preferably a branched alkyl group having 4 to 12 carbon atoms, still more preferably a 2-methyl hexyl group, a 2-ethyl hexyl group, a 2-methyl octyl group, or a 2-ethyl octyl group, and particularly preferably a 2-ethyl hexyl group. As described in the examples described below, when a branched alkyl group is introduced as $R^2$, the dispersibility of the CNT in the thermoelectric conversion material is improved, and favorable film-forming properties can be obtained.

In the present invention, as described above, $R^1$ and $R^2$ are preferably different alkyl groups, and it is more preferably that $R^1$ be a straight alkyl group and $R^2$ be a branched alkyl group.

The combination of $R^1$ and $R^2$ is preferably a combination of $R^1$ of an alkyl group having 1 to 4 carbon atoms and $R^2$ of an alkyl group having 4 to 12 carbon atoms, more preferably a combination of $R^1$ of a straight alkyl group having 1 to 3 carbon atoms and $R^2$ of a branched alkyl group having 4 to 12 carbon atoms, still more preferably a combination of $R^1$ of a methyl group and $R^2$ of a 2-methyl hexyl group, a 2-ethyl hexyl group, a 2-methyloctyl group or a 2-ethyloctyl group, and particularly preferably a combination of $R^1$ of a methyl group and $R^2$ of a 2-ethyl hexyl group.

Specific examples of the polythiophene polymer represented by Formula (1) will be illustrated below, but the present invention is not limited thereto.

[Chem. 3]
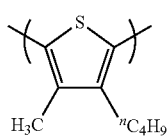
I-1
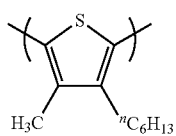
I-2
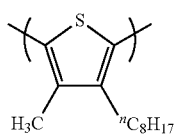
I-3
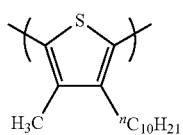
I-4
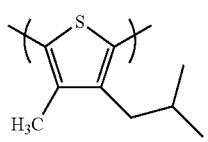
I-5
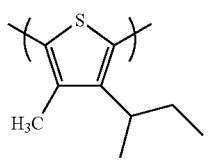
I-6
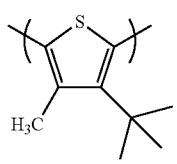
I-7
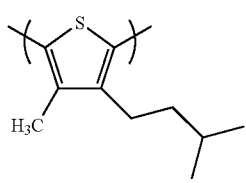
I-8
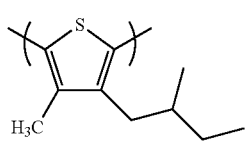
I-9
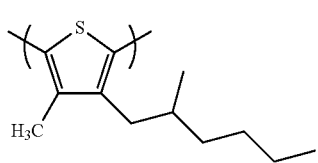
I-10
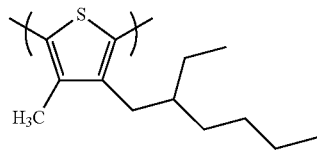
I-11
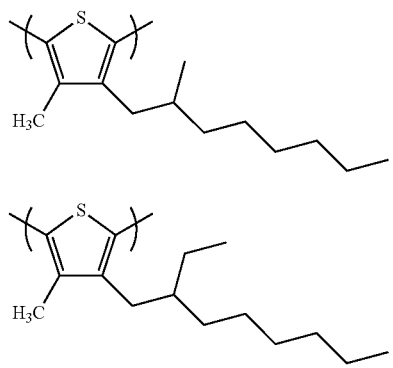
I-12
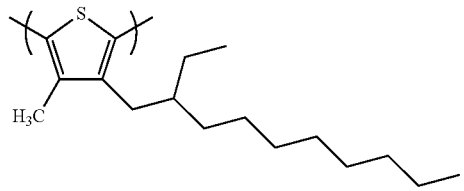
I-13
I-14
[Chem. 4]
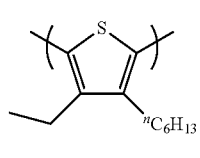
II-1
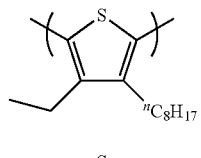
II-2
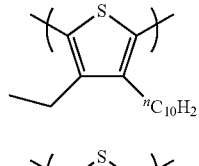
II-3
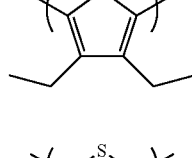
II-4
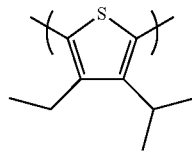
II-5
II-6

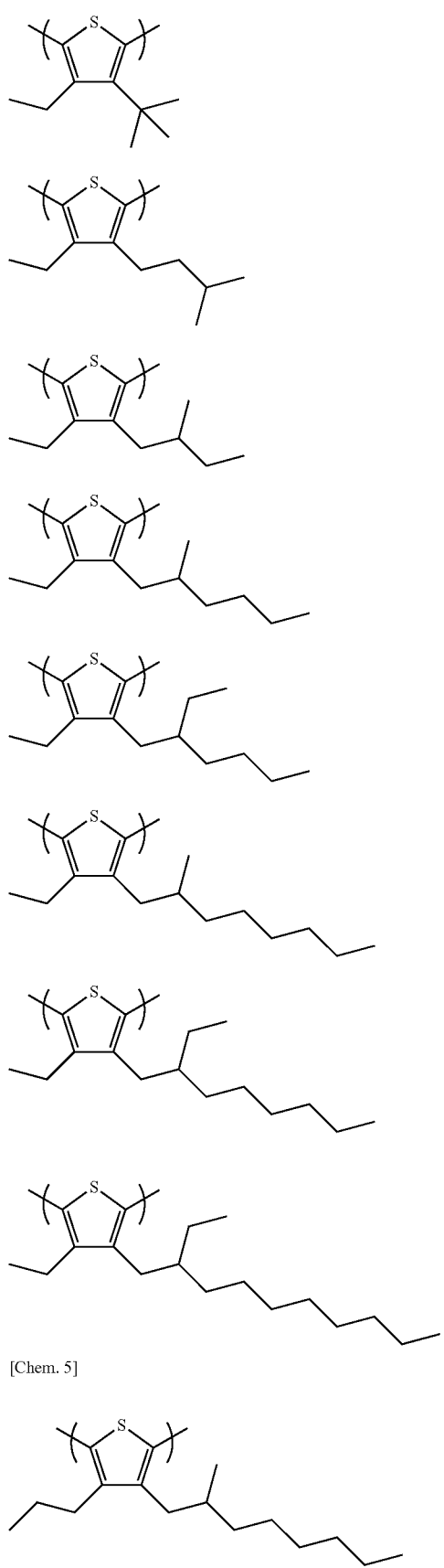
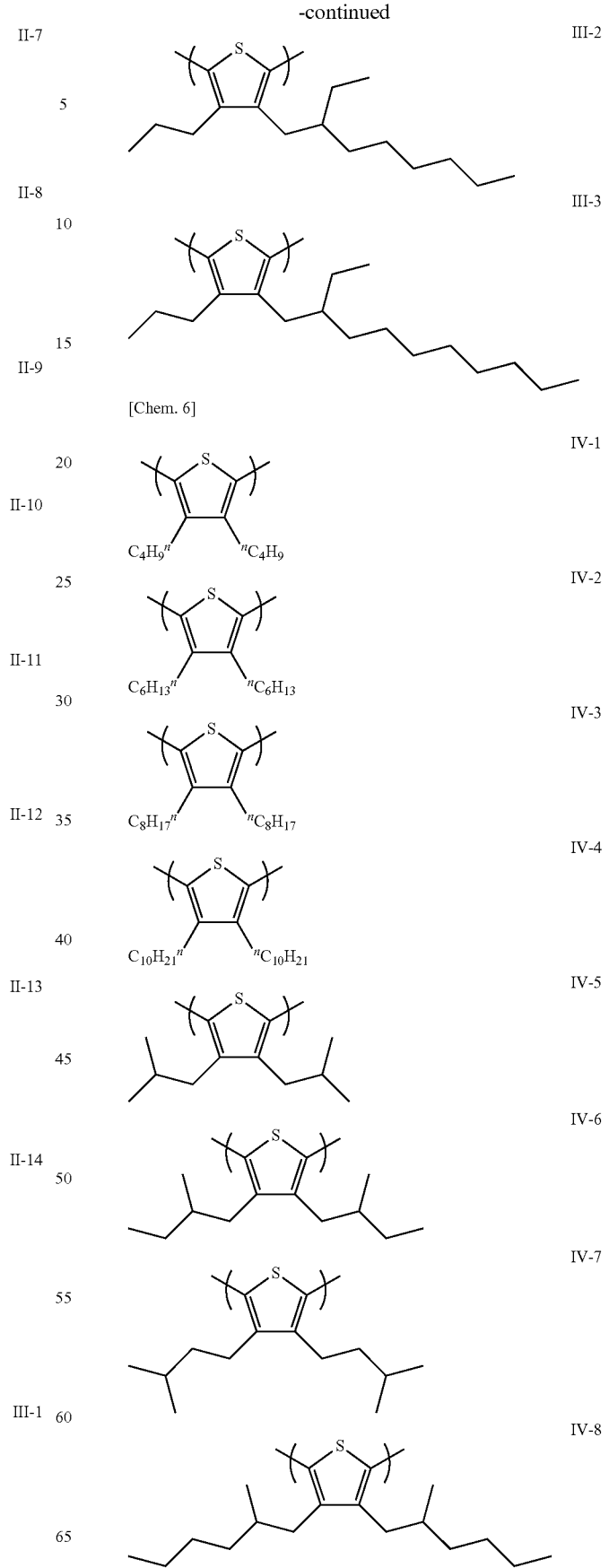

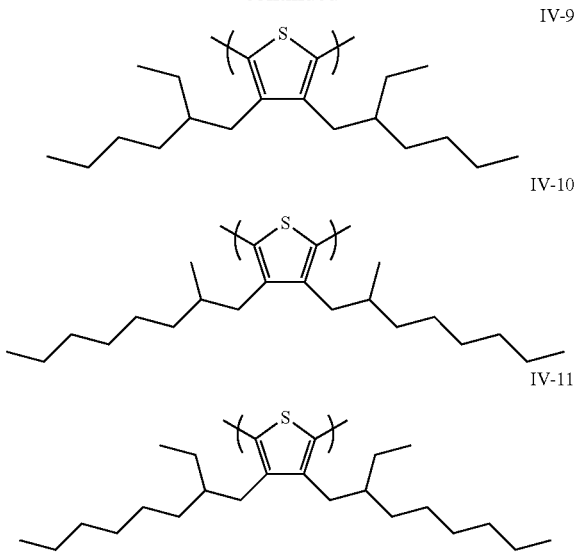

As represented in Formula (1), the polythiophene polymer used in the present invention has a two-position substitution structure in which both the third and fourth positions of a thiophene ring, which is the repeating unit, are substituted by alkyl groups.

Since the second and fifth positions of the thiophene ring are active positions, under ordinary conditions, a polymerization reaction selectively proceeds in the second or fifth position, and polythiophene-2,5-diyl is obtained. In the case of polythiphene-2,5-diyl having a thiophene ring with a two-position substitution structure as a structural unit as used in the present invention, the generated polythiophene main chain is significantly twisted due to the steric repulsion between the thiophene rings. The polythiophene main chain having the thiophene ring with a two-position substitution structure as the structural unit is more twisted compared with polythiophene having a thiophene ring with a one-position substitution structure in which only either the third or fourth position of the thiophene ring is substituted as the structural unit.

An example of a method for measuring the twist degree of the polythiophene main chain is a method for measuring the ionization potential of the polythiophene. The ionization potential indicates the energy necessary for a molecule to be ionized, and corresponds to the energy level of the highest occupied molecular orbital (HOMO). Generally, when the conjugate system of an organic molecule expands, and thus the interaction between orbits in the molecule increases, the energy level of HOMO becomes positively decreased. It is known that the ionization potential of polyalkyl thiophene having a one-position substitution structure is approximately 5.2 eV, and it is possible to determine that, as the ionization potential becomes positively greater than 5.2 eV (the level of HOMO is deep), the degree of conjugation of the polythiophene main chain becomes smaller, that is, the twist degree of the polythiophene main chain becomes greater. Examples of the method for measuring the ionization potential include electrochemical methods such as photoelectric spectroscopy or cyclic voltammetry.

It is considered that, when the thermoelectric conversion material of the present invention includes a polymer made of a repeating unit having a polythiophene structure of the two-position substitution structure together with the CNT, a high electric conduction property can be realized. This is considered to be because the use of polythiophene having a polymer main chain that is significantly twisted causes highly efficient carrier migration as described below. Since carriers (holes) generated in polythiophene (carrier mobility of 0.1 $cm^2/(V \cdot s)$) which is an electrically conductive polymer are injected into the CNT, and migrate in the CNT which allows the carriers to easily migrate (carrier mobility of 30000 $cm^2/(V \cdot s)$) at a high speed, a high electric conduction property is developed. Particularly, in a case in which polythiophene having a significantly twisted main chain is used, it is assumed that the HOMO level is deep as described above, and thus holes can more easily inject into the CNT, and consequently, the electric conduction property further improves.

In the polythiophene polymer used in the present invention, the repeating number of the repeating units represented by Formula (1) is preferably in a range of approximately 4 to 2,000. In addition, the molecular weight is, in terms of the weight-average molecular weight, preferably in a range of 5,000 to 250,000, more preferably in a range of 10,000 to 200,000, and still more preferably in a range of 15,000 to 170,000. The weight-average molecular weight can be measured using gel permeation chromatography (GPC).

As the polythiophene polymer used in the present invention, a commercially available product can be used, or a polythiophene polymer can be synthesized using a method of oxidation polymerization using iron chloride in which 2- and 5-position unsubstituted thiophene is used as a raw material monomer or a polymerization method in which a Ni(II) catalyst/Grignard reagent, for which a 2- and 5-position Br-substituted thiophene is used as a raw material monomer, is used.

The content of the polythiophene polymer in the thermoelectric conversion material is, in the total solid content, preferably in a range of 20 mass % to 80 mass %, more preferably in a range of 30 mass % to 75 mass %, and particularly preferably in a range of 35 mass % to 70 mass %.

[Non-Conjugated Macromolecule]

The thermoelectric conversion material of the present invention preferably includes a non-conjugated macromolecule in addition to the above-described CNT and polythiophene polymer.

The non-conjugated macromolecule used in the thermoelectric conversion material is a macromolecular compound having a conjugated structure with a polymer main chain and exhibiting no electric conduction properties. Specifically, the non-conjugated macromolecule is a macromolecule other than a macromolecule in which the polymer main chain is constituted of an aromatic ring (a carbon ring-based aromatic ring or a hetero aromatic ring), a ring, a group, or an atom selected from hetero atoms having an ethynylene bond, an ethenylene bond, and a lone electron pair.

In the present invention, an ordinarily-known non-conjugated macromolecule can be used with no particular limitation regarding the type thereof as long as the non-conjugated macromolecule satisfies the above-described conditions. Preferably, a macromolecular compound obtained by polymerizing a compound selected from a group consisting of a vinyl compound, a (meth)acrylate compound, a carbonate compound, an ester compound, an amid compound, an imide compound, a fluorine compound, and a siloxane compound is used.

Specific examples of the vinyl compound include vinyl arylamines such as styrene, vinyl pyrrolidone, vinylcarbazole, vinylpyridine, vinylnaphthalene, vinylphenol, vinyl aceate, styrenesulfonic acid, vinyl alcohol, and vinyl triphenylamine; vinyl trialkylamines such as vinyl tributylamine; and the like.

Specific examples of the (meth)acrylate compound include alkyl group-containing hydrophobic acrylates such as methyl acrylate, ethyl acrylate, propyl acrylate, and butyl acylate; acrylate-based monomers such as hydroxyl group-containing acrylates such as 2-hydroxyethyl acrylate, 1-hydroyethyl acrylate, 2-hydroxypropyl acrylate, 3-hydroxypropyle acrylate, 1-hydroxypropyl acrylate, 4-hydroxybutyl acrylate, 3-hydroxybutyl acrylate, 2-hydroxybutyl acrylate, and 1-hydroxybutyl acrylate; methacrylate-based monomers in which an acryloyl group in the above-described monomer is substituted by a methacryloyl group; and the like.

Specific examples of the polymer obtained by polymerizing the carbonate compound include general-purpose polycarbonate constituted of bisphenol A and phosgene, LUPIZETA (trade name, manufactured by Mitsubishi Gas Chemical Company, Inc.), PANLITE (trade name, manufactured by Teijin Chemicals Ltd.), and the like.

Specific examples of the ester compound include lactic acid. In addition, specific examples of the polymer obtained by polymerizing the ester compound include VYLON (trade name, manufactured by Toyobo Co., Ltd.), and the like.

Specific examples of the polymer obtained by polymerizing the amide compound include PA-100 (trade name, manufactured by T&K TOKA Corporation) and the like.

Specific examples of the polymer obtained by polymerizing the imide compound include SOLPIT 6,6-PI (trade name, manufactured by Solpit Industries, Ltd.) and the like.

Specific examples of the fluorine compound include vinylidene fluoride, vinyl fluoride, and the like.

Specific examples of the siloxane compound include diphenyl siloxane, phenyl methyl siloxane, and the like.

The non-conjugated macromolecule may be a homopolymer or a copolymer.

In the present invention, a macromolecular compound obtained by polymerizing the vinyl compound is more preferably used as the non-conjugated macromolecule.

The content of the non-conjugated macromolecule in the thermoelectric conversion material is preferably in a range of 10 parts by mass to 1500 parts by mass, more preferably in a range of 30 parts by mass to 1200 parts by mass, and particularly preferably in a range of 80 parts by mass to 1000 parts by mass with respect to 100 parts by mass of the polythiophene polymer.

The non-conjugated macromolecule is preferably hydrophobic, and more preferably includes no hydrophilic group such as sulfonic acid or hydroxyl group in the molecules. In addition, the non-conjugated macromolecule preferably has a solubility parameter (SP value) of 11 or less. The non-conjugated macromolecule having an SP value of 11 or less is preferably a polyvinyl compound such as polystyrene, polyvinyl naphthalene, or polyvinyl acetate, a poly(meth)acrylate such as polymethyl acrylate, ethyl acrylate, propyl acrylate, or butyl acrylate, a polyester compound, polycarbonate, polyvinylidene fluoride, or the like, and is more preferably polystyrene, polyvinyl naphthalene, polymethyl acrylate, or polycarbonate.

[Solvent]

The thermoelectric conversion material of the present invention preferably includes a solvent in addition to the above-described CNT and polythiophene polymer. The thermoelectric conversion material of the present invention is more preferably a CNT-dispersed solution including a polythiophene component dissolved in the solvent and CNT dispersed therein.

The solvent is preferably capable of favorably dispersing or dissolving the respective components, and water, an organic solvent, or a mixed solvent thereof can be used. The solvent is preferably an organic solvent. Preferable examples thereof include an alcohol; a halogen-based solvent such as chloroform; an aprotic polar solvent such as DMF, NMP, or DMSO; an aromatic solvent such as chlorobenzene, dichlorobenzene, benzene, toluene, xylene, mesitylene, tetralin, tetremethylbenzene, or pyridine; a ketone-based solvent such as cyclohexanone, acetone, or methyl ethyl ketone; an ether-based solvent such as diethyl ether, THF t-butyl methyl ether, dimethoxy ethane, or diglyme; and the like. More preferable examples thereof include a halogen-based solvent such as chloroform; an aprotic polar solvent such as DMF or NMP; an aromatic solvent such as dichlorobenzene, xylene, tetralin, mesitylene, or tetremethylbenzene; an ether-based solvent such as THF; and the like.

In addition, the solvent is preferably deaerated in advance. The concentration of dissolved oxygen in the solvent is preferably set to 10 ppm or less. Examples of a deaerating method include a method in which an ultrasonic wave is radiated at a reduced pressure, a method in which an inert gas such as argon is bubbled, and the like.

Furthermore, the solvent is preferably dehydrated in advance. The amount of moisture in the solvent is preferably set to 1000 ppm or less, and more preferably set to 100 ppm or less. As a method for dehydration, a well-known method such as a method in which a molecular sieve is used, or distillation can be used.

The amount of the solvent in the thermoelectric conversion material is preferably in a range of 60 mass % to 99.95 mass %, more preferably in a range of 70 mass % to 99.9 mass %, and still more preferably in a range of 80 mass % to 99.8 mass % with respect to the total mass of the total solid content of the thermoelectric conversion material and the solvent.

[Other Components]

The thermoelectric conversion material of the present invention may include other components in addition to the above-described components.

The thermoelectric conversion material may include a surfactant from the viewpoint of preventing variation during coating.

The thermoelectric conversion material may include lithium hydroxide, ammonium persulfate, an ultraviolet absorber, a polymerization inhibitor, a levelling additive, a matting agent, or the like to improve the dispersion stability.

The thermoelectric conversion material may include inorganic fine particles, polymer fine particles, a silane coupling agent, waxes, and the like from the viewpoint of adjusting the film strength and the viscosity.

The thermoelectric conversion material may include a binder polymer or the like from the viewpoint of improving the coating properties by adjusting the viscosity.

The thermoelectric conversion material may include a fluorine-based compound or the like from the viewpoint of increasing the transparency by decreasing the refractive index.

Additionally, an antioxidant, a light-resistant stabilizer, a heat-resistant stabilizer, a plasticizer, and the like are preferably included.

The content of these components is preferably in a range of approximately 0.1 mass % to 15 mass % with respect to the total mass of the thermoelectric conversion material.

[Preparation of Thermoelectric Conversion Material]

The thermoelectric conversion material of the present invention can be prepared by mixing the respective components. Preferably, the CNT and the polythiophene polymer are added to the solvent, are mixed together, and are dissolved or dispersed, thereby preparing the thermoelectric conversion material. The order of adding and mixing the respective components is not particularly limited, but it is preferable to add a predetermined amount of the polythiophene polymer to the solvent in advance, and then add and disperse a predetermined amount of the CNT.

There is no particular limitation regarding the preparation method, and the thermoelectric conversion material can be prepared using an ordinary mixing method, apparatus, and the like. For example, a dispersion method such as a mechanical homogenizer method, a jaw crasher method, an ultracentrifugal crushing method, a cutting mill method, an automatic mortar method, a disc mill method, a ball mill method, or an ultrasonic dispersion method can be used. In addition, if necessary, a combination of two or more of the above-described methods may be used. The combination of the dispersion methods is preferably a combination of the mechanical homogenizer method and the ultrasonic dispersion method. The order of combination is not limited, and the components may be dispersed by sequentially using different dispersion methods, or by using different dispersion methods at the same time. A preferable order is that, in the beginning, the components are dispersed using a dispersion method having a weak dispersion energy, and then re-dispersed using a dispersion method having a strong dispersion energy. Then, the CNT can be dispersed in a high concentration with no defect. Specifically, a combination of the mechanical homogenizer method and then the ultrasonic dispersion method is preferable.

The thermoelectric conversion material can also be prepared in the atmosphere, but is preferably prepared in an inert gas atmosphere. The inert gas atmosphere refers to a state in which the concentration of oxygen is smaller than that in the atmosphere, and is preferably 10% or less. An example of the method for setting the inert gas atmosphere that is preferably used is a method in which the atmosphere is substituted by gas such as nitrogen or argon.

In addition, the temperature during the preparation is preferably in a range of 0° C. to 50° C.

There are cases in which the CNT included in the obtained thermoelectric conversion material includes defective CNT. The defects of the above-described CNT degrade the electric conduction properties of the thermoelectric conversion material, and thus it is preferable to reduce the defective CNT. The amount of the defects of the CNT in the thermoelectric conversion material can be estimated from the ratio G/D of the G band to the D band in the Raman spectrum. It can be assumed that a high G/D ratio indicates the CNT material including a small amount of defects. In the present invention, the G/D ratio of the thermoelectric conversion material is preferably 10 or more, and more preferably 30 or more.

[Thermoelectric Conversion Element]

The thermoelectric conversion element of the present invention is produced using the thermoelectric conversion material of the present invention for a thermoelectric conversion layer. The thermoelectric conversion layer can be obtained by molding the thermoelectric conversion material on a base material, and there is no particular limitation regarding the shape, the preparation method, and the like, but the thermoelectric conversion material of the present invention has favorable CNT-dispersing properties, and therefore it is possible to form the thermoelectric conversion layer by applying the thermoelectric conversion material and forming a film on the base material.

As the method for applying the thermoelectric conversion material, for example, a well-known coating method such as spin coating, extrusion die coating, blade coating, bar coating, screen printing, stencil printing, roll coating, curtain coating, spray coating, dip coating, or ink jet printing can be used.

After the coating step, if necessary, a heating step or a drying step may be provided to distill away the solvent and the like.

In the present invention, the thermoelectric conversion material is preferably molded using the ink jet printing method among the above-described application methods. The ink jet printing method is a printing method in which ink is sprayed from a nozzle, and ink particles are accumulated on a substrate. The thermoelectric conversion material of the present invention can be formed into a thermoelectric conversion layer by applying ink using the ink jet printing method.

[Ink Jet Printing Method]

There is no particular limitation regarding an ink jet apparatus used in the present invention, and a commercially available ink jet apparatus can be used. A mode for discharging ink used in the ink jet apparatus is also not particularly limited, and, for example, a charge-controlling mode in which ink is discharged using an electrostatic attraction force, a piezo mode in which the vibration pressure of a piezo element is used, a thermal mode in which ink is heated so as to form air bubbles, and the generated pressure is used, and the like can be used. Among the above-described modes, the piezo mode is preferable from the standpoint of suppressing material deterioration.

In the present invention, as a piezo-mode ink jet apparatus, an apparatus including an ink supply system and a temperature sensor is preferably used. The ink supply system is constituted of, for example, a parent tank, a supply pipe, an ink supply tank immediately before an ink jet head, a filter, and the piezo-type inkjet head. The piezo-type ink jet head can be driven so that the ink can be discharged in an amount of 0.1 pl to 100 pl, and preferably 0.5 pl to 20 pl. Liquid droplets formed by the discharge may be formed at intervals, or may be formed so as to connect with each other, but the liquid droplets are preferably formed at intervals from the viewpoint of obtaining a uniform and thin thickness of the remaining film. The total amount of the liquid droplets varies depending on a pattern to be formed, and is adjusted so that the pattern and the remaining film obtain an appropriate thickness. In addition, it is preferably to vary the intervals between the liquid droplets depending on the varying intervals in the pattern. Specific examples of an ink jet apparatus having the above-described functions include a DMP-3000 or a DMP-2831 manufactured by Fujifilm Dimatix, Inc..

From the standpoint of controlling the ink viscosity, in the ink jet apparatus, it is preferable to set the ink temperature to be constant during the discharge. Therefore, the ink jet apparatus preferably has a capability of controlling the temperature in a certain section or throughout from the ink supply tank to the ink jet head. As a method for controlling the temperature, for example, it is preferable to provide a plurality of temperature sensors in individual pipe sections, and control the heating depending on the ink flow rate, environment temperature, and the like. The temperature sensors can be provided in the ink supply tank and near the nozzle in the ink jet head.

In a case in which a film is formed using the thermoelectric conversion material of the present invention and the ink jet printing method, when the discharging properties from the ink jet nozzles are taken into account, at the temperature during the discharge, the viscosity of the thermoelectric conversion material is preferably in a range of 0.5 mPa·s to 30 mPa·s, more preferably in a range of 0.5 mPa·s to 20 mPa·s, and still more preferably in a range of 1 mPa·s to 15 mPa·s. The viscosity of the thermoelectric conversion material can be adjusted by appropriately increasing or decreasing the content of the solid content or the amount of the solvent.

In addition, in a case in which a film is formed using the ink jet printing method, the surface tension of the thermoelectric conversion material is preferably in a range of 20 mN/m to 40 mN/m, and more preferably in a range of 23 mN/m to 35 mN/m. The surface tension of the thermoelectric conversion material can be adjusted by using a surfactant or the like.

To obtain a desired thickness of the thermoelectric conversion layer, it is preferable to repeat the ink jet printing of the thermoelectric conversion material. In a case in which the ink jet printing is repeated, it is preferable to distill away the solvent and the like by providing a heating step or a drying step after the ink jet printing, and then carry out additional ink jet printing.

As the base material, it is possible to use a glass substrate, a transparent ceramic substrate, a metal substrate, a plastic film substrate, or the like. Specific examples of a plastic film that can be used in the present invention include polyester films such as polyethylene terephthalate, polyethylene isophthalate, polyethylene naphthalate, polybutylene terephthalate, poly(1,4-cyclohexylene dimethylene terephthalate), polyethylene-2,6-phthalenedicarboxylate, and a polyester film of bisphenol A and iso- and terephthalic acid; polycycloolefin films such as ZEONOR Film (manufactured by Zeon Corporation), ARTON FILM (manufactured by JSR Corporation), and SUMILITE FS1700 (manufactured by Sumitomo Bakelite Co., Ltd.), all of which are trade names; polyimide films such as KAPTON (manufactured by Du Pont-Toray Co., Ltd.), APICAL (manufactured by Kaneka Corporation), UPILEX (manufactured by Ube Industries, Ltd.) and POMIRAN (manufactured by Arakawa Chemical Industries, Ltd.), all of which are trade names; polycarbonate films such as PURE ACE (manufactured by Teijin Chemicals Ltd.) and ELMEC (manufactured by Kaneka Corporation), all of which are trade names; polyether ether ketone films such as SUMILITE FS1100 (trade name, manufactured by Sumitomo Bakelite Co., Ltd.); polyphenylsulfide films such as TORELINA (trade name, manufactured by Toray Industries, Inc.); and the like. The base material is appropriately selected depending on the usage conditions and environment; however, from viewpoints of procurement readiness, preferably, heat resistance at 100° C. or higher, economic efficiency, and the effect, commercially available polyethylene terephthalate, polyethylene naphthalate, a variety of polyimides, polycarbonate films, and the like are preferred. Particularly, it is preferable to use a base material including a variety of electrode materials provided on a pressure-bonding surface with the thermoelectric conversion layer. As the electrode materials, it is possible to use a transparent electrode such as ITO and ZnO; a metal electrode such as silver, copper, gold, and aluminum; a carbon material such as CNT and graphene; an organic material such as PEDOT/PSS; electrically conductive paste in which electrically conductive fine particles of silver, carbon, and the like are dispersed; and electrically conductive paste including metal nanowires of silver, copper, aluminum, and the like.

[Constitution of Thermoelectric Conversion Element]

The thermoelectric conversion element of the present invention includes a thermoelectric conversion layer for which the thermoelectric conversion material of the present invention is used, and the constitution thereof is not particularly limited. However, the element preferably includes the base material (substrate) and the thermoelectric conversion layer provided on the base material, more preferably further includes electrodes that electrically connect the base material and the thermoelectric conversion layer, and still more preferably includes the base material, a pair of electrodes on the base material, and the thermoelectric conversion layer disposed between the pair of the electrodes.

Figure 2:
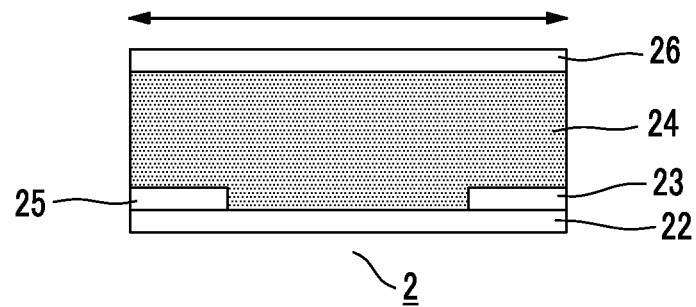
FIG. 2 is a view schematically illustrating an example of the thermoelectric conversion element of the present invention. The arrow in FIG. 2 indicates the direction of a temperature difference imparted during the use of the element.

Examples of the structure of the thermoelectric conversion element of the present invention are the structure of an element (1) illustrated in FIG. 1 and the structure of an element (2) illustrated in FIG. 2. The element (1) illustrated in FIG. 1 includes a pair of electrodes including a first electrode (13) and a second electrode (15) on a first base material (12) and a thermoelectric conversion layer (14) of the thermoelectric conversion material of the present invention between the electrodes. The second electrode (15) is disposed on the surface of a second base material (16), and metal plates (11 and 17) are provided on the outside of the first base material (12) and the second base material (16) so as to face each other. The element (2) illustrated in FIG. 2 is provided with a first electrode (23) and a second electrode (25) on a first base material (22), and is provided with a thermoelectric conversion layer (24) of the thermoelectric conversion material thereon. The arrows in FIGS. 1 and 2 indicate the orientations of temperature difference when the thermoelectric conversion element is being used.

The thermoelectric conversion element of the present invention is provided with the thermoelectric conversion material of the present invention on the base material in a film shape, and the base material is preferably made to function as the first base material (12, 22). That is, the structure is preferably a structure in which a variety of the above-described electrode materials are provided on the base material surface (the pressure-bonding surface with the thermoelectric conversion layer), and the thermoelectric conversion layer formed using the thermoelectric conversion material of the present invention is provided thereon.

One surface of the formed thermoelectric conversion layer is covered with the base material, and, when the thermoelectric conversion layer is used to prepare the thermoelectric conversion element, it is preferable to pressure-bond the base material (second base material (16, 26)) to the other surface from the viewpoint of protecting the film. In addition, a variety of the above-described electrode materials may be provided in advance on the surface (the pressure-bonding surface with the thermoelectric conversion layer) of the second base material (16). In addition, the second base material and the thermoelectric conversion layer are preferably pressure-bonded through heating at a temperature in a range of approximately 100° C. to 200° C. from the viewpoint of improving adhesiveness.

In the thermoelectric conversion element of the present invention, the film thickness of the thermoelectric conversion layer is preferably in a range of 0.1 μm to 1000 μm, and more preferably in a range of 1 μm to 100 μm. When the film thickness is set in the above-described range, the temperature difference can be easily imparted, and it is possible to prevent the resistance in the film from increasing.

In addition, the thicknesses of the first and second base materials are preferably in a range of 30 µm to 3000 µm, more preferably in a range of 50 µm to 1000 µm, still more preferably in a range of 100 µm to 1000 µm, and particularly preferably in a range of 200 µm to 800 µm in terms of handling properties, durability, and the like. When the thickness of the base material is set in the above-described range, the thermal conductivity does not decrease, and the film (thermoelectric conversion layer) is not easily damaged due to external shock.

Generally, in the thermoelectric conversion element, compared with a photoelectric conversion element such as an element for an organic thin film solar cell, one organic layer is applied and formed as the thermoelectric conversion layer, and the element can be easily manufactured. Particularly, when the thermoelectric conversion material of the present invention is used, it is possible to increase the film thickness approximately 100 times to 1000 times compared with an element for an organic thin film solar cell, and the chemical stability against oxygen or moisture in the air improves.

For the article for thermoelectric power generation of the present invention, the thermoelectric conversion element of the present invention is used as a power generation element. Specifically, the thermoelectric conversion element of the present invention is preferably used for usages such as a power generator such as a hot water heat power generator, a solar power generator, or a waste heat power generator, or a power supply for a wrist watch, a semiconductor-driving power supply, or a power supply for a small-scale sensor.

EXAMPLES

Hereinafter, the present invention will be described in more detail on the basis of examples, but the present invention is not limited thereto.

The structures of polythiophene polymers used in the examples and comparative examples are illustrated below.

[Chem. 7]

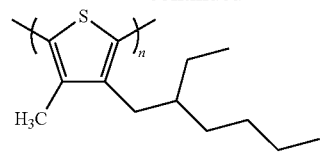

POLYTHIOPHENE 1: POLY(3-METHYL-4-HEXYLTHIOPHENE-2,5-DIYL)
WEIGHT-AVERAGE MOLECULAR WEIGHT: 65,000

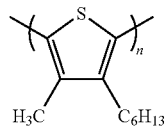

POLYTHIOPHENE 2: POLY(3-METHYL-4-OCTYLTHIOPHENE-2,5-DIYL)
WEIGHT-AVERAGE MOLECULAR WEIGHT: 98,000

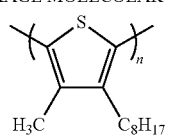

POLYTHIOPHENE 3: POLY(3-METHYL-4-DECYLTHIOPHENE-2,5-DIYL)
WEIGHT-AVERAGE MOLECULAR WEIGHT: 121,000

-continued

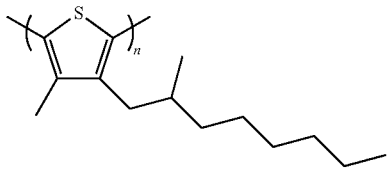

POLYTHIOPHENE 4: POLY[3-METHYL-4-(2-ETHYLHEXYL)THIOPHENE-2,5-DIYL)
WEIGHT-AVERAGE MOLECULAR WEIGHT: 90,000

[Chem. 8]

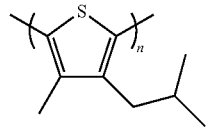

POLYTHIOPHENE 5: POLY[3-METHYL-4-(2-METHYLOCTYL)THIOPHENE-2,5-DIYL]
WEIGHT-AVERAGE MOLECULAR WEIGHT: 100,000

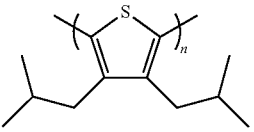

POLYTHIOPHENE 6: POLY[3-METHYL-4-ISOBUTYLTHIOPHENE-2,5-DIYL)
WEIGHT-AVERAGE MOLECULAR WEIGHT: 60,000

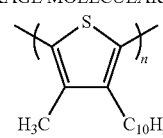

POLYTHIOPHENE 7: POLY[3,4-DIISOBUTYL THIOPHENE-2,5-DIYL)
WEIGHT-AVERAGE MOLECULAR WEIGHT: 30,000

[Chem. 9]

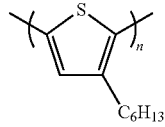

POLYTHIOPHENE 11: POLY(3-HEXYLTHIOPHENE)
WEIGHT-AVERAGE MOLECULAR WEIGHT: 87,000

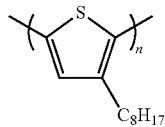

POLYTHIOPHENE 12: POLY(3-OCTYLTHIOPHENE)
WEIGHT-AVERAGE MOLECULAR WEIGHT: 45,000

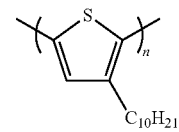

POLYTHIOPHENE 13: POLY[3-(3-DECYLTHIOPHENE)
WEIGHT-AVERAGE MOLECULAR WEIGHT: 35,000

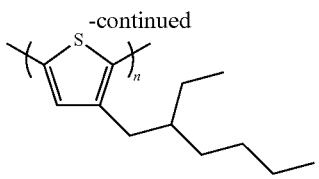

POLYTHIOPHENE 14: POLY[3-(2-ETHYL HEXYL)THIOPHENE)
WEIGHT-AVERAGE MOLECULAR WEIGHT: 127,000

Commercially available products manufactured by American Dye Source, Inc. were used as the polythiophenes 1 to 3, and commercially available products manufactured by Sigma-Aldrich Japan K.K. were used as the polythiophenes 11 to 13.

The polythiophenes 4, 5 to 7, and 14 were synthesized in the following order.

1. Synthesis of polythiophene 4

(1) Synthesis of 3-methyl-4-(2-ethyl hexyl)thiophene (Raw Material Monomer A)

3 g (17 mmol) of 3-methyl-4-bromothiophene was dissolved in 20 mL of dehydrated THF in a nitrogen flow, and was cooled to 0° C. 18 mL (18 mmol) of 2-ethyl hexyl magnesium bromide (1 M diethyl ether solution) was added dropwise to this solution, and, after the completion of the dropwise addition, was heated to reflux for six hours. After the reaction solution was cooled in the air, an organic layer was separated by adding water and a 10% hydrochloric acid aqueous solution, was washed using water and saline water, and was dried using magnesium sulfate. After the condensation of the solution, the solution was purified using silica gel column chromatograph (hexane 100%), thereby obtaining 1.3 g (yield: 36%) of a colorless raw material monomer A. The obtained compound was conformed to be 3-methyl-4-(2-ethyl hexyl)thiophene through $^1$H-NMR.

(2) Synthesis of polythiophene 4

0.82 g (5.06 mmol) of iron (III) chloride was dissolved in 10 mL of chloroform in a nitrogen flow, 0.27 g (1.27 mmol) of the raw material monomer A synthesized above was added dropwise to this solution, the components were stirred for two hours at room temperature, and the reaction was stopped by adding water and methanol. The generated black sediment was dissolved again in 100 mL of chloroform, and metal impurities were washed away by adding and stirring 100 mL of additional water. A chloroform layer was condensed, and acetone was added, thereby obtaining red sediment. This sediment was Soxhlet-washed in a solvent of acetone and methanol (having a volume ratio of 1:1), thereby obtaining the polythiophene 4. The obtained compound was conformed to be the polythiophene 4 having the structure illustrated above through $^1$H-NMR.

2. Synthesis of polythiophene 5

The polythiophene 5 was synthesized using the method described in JP2000-264957A.

3. Synthesis of polythiophene 6

(1) Synthesis of 3-methyl-4-isobutylthiophene (Raw Material Monomer B)

A raw material monomer B was synthesized in the same manner as the synthesis of the raw material monomer A except for the fact that the same moles of isobutyl magnesium bromide (1 M THF solution) was used instead of the 2-ethyl hexyl magnesium bromide as the raw material in the synthesis of the raw material monomer A. The obtained compound was conformed to be 3-methyl-4-isobutylthiophene through $^1$H-NMR.

(2) Synthesis of polythiophene 6

A polythiophene 6 was synthesized in the same manner as the synthesis of the polythiophene 4 except for the fact that the same moles of the raw material monomer B was used instead of the raw material monomer A as the raw material in the synthesis of the polythiophene 4. The obtained compound was conformed to be the polythiophene 6 having the structure illustrated above through $^1$H-NMR.

4. Synthesis of polythiophene 7

(1) Synthesis of 3,4-diisobutyl thiophene (Raw Material Monomer C)

2.45 g (10 mmol) of 3,4-dibromothiophene was dissolved in 20 mL of dehydrated THF in a nitrogen flow, and was cooled to 0° C. 22 mL (22 mmol) of isobutyl magnesium bromide (1 M THF solution) was added dropwise to this solution, and, after the completion of the dropwise addition, was heated to reflux for two hours. After the reaction solution was cooled in the air, an organic layer was separated by adding water and a 10% hydrochloric acid aqueous solution, was washed using water and saline water, and was dried using magnesium sulfate. After the condensation of the solution, the solution was purified using silica gel column chromatograph (hexane 100%), thereby obtaining 0.6 g (yield: 30%) of a colorless raw material monomer C. The obtained compound was conformed to be 3,4-diisobutyl thiophene through $^1$H-NMR.

(2) Synthesis of polythiophene 7

0.82 g (5.06 mmol) of iron (III) chloride was dissolved in 10 mL of chloroform in a nitrogen flow. 0.25 g (1.27 mmol) of the raw material monomer C synthesized above was added dropwise to this solution, the components were stirred for two hours at room temperature, and the reaction was stopped by adding water and methanol. The generated black sediment was dissolved again in 100 mL of chloroform, and then metal impurities were washed away by adding and stirring 100 mL of additional water. A chloroform layer was condensed, and acetone was added, thereby obtaining sediment. This sediment was Soxhlet-washed in a solvent of acetone and methanol (having a volume ratio of 1:1), thereby obtaining the polythiophene 7. The obtained compound was conformed to be the polythiophene 7 having the structure illustrated above through $^1$H-NMR.

5. Synthesis of polythiophene 14

(1) Synthesis of 3-(2-ethyl hexyl)thiophene (Raw Material Monomer D)

3.27 g (20 mmol) of 3-bromothiophene was dissolved in 20 mL of dehydrated THF in a nitrogen flow, and was cooled to 0° C. 24 mL (24 mmol) of 2-ethyl hexyl magnesium bromide (1 M diethyl ether solution) was added dropwise to this solution, and, after the completion of the dropwise addition, was heated to reflux for three hours. After the reaction solution was cooled in the air, an organic layer was separated by adding water and a 10% hydrochloric acid aqueous solution, was washed using water and saline water, and was dried using magnesium sulfate. After the condensation of the solution, the solution was purified using silica gel column chromatograph (hexane 100%), thereby obtaining 2.6 g (yield: 66%) of a colorless raw material monomer D. The obtained compound was conformed to be 3-(2-ethyl hexyl)thiophene through $^1$H-NMR.

(2) Synthesis of polythiophene 14

0.82 g (5.06 mmol) of iron (III) chloride was dissolved in 10 mL of chloroform in a nitrogen flow. 0.28 g (1.27 mmol) of the raw material monomer D synthesized above was added dropwise to this solution, the components were stirred for two hours at room temperature, and the reaction was stopped by adding water and methanol. The generated black sediment was dissolved again in 100 mL of chloroform, and then metal impurities were washed away by adding and stirring 100 mL of additional water. A chloroform layer was condensed, and acetone was added, thereby obtaining sediment. This sediment was Soxhlet-washed in a solvent of acetone and methanol (having a volume ratio of 1:1), thereby obtaining the polythiophene 14. The obtained compound was conformed to be the polythiophene 14 having the structure illustrated above through $^1$H-NMR.

The molecular weight of the polythiophene was obtained through gel-permeation chromatography (GPC). o-Dichlorobenzene was added to each specimen, was dissolved at 145° C., and was filtered using a 1.0 μm sintered filter, thereby preparing 0.15 wv % of a specimen solution. The specimen solution was used for the measurement. The average molecular weight was measured under the constitution and conditions of a device: "Alliance GPC2000 (manufactured by Waters)", a column: TSKgel GMH6-HT× 2+TSKgel GMH6-HTL×2 (for all, 7.5 mmI.D.×30 cm, manufactured by Tosoh Corporation), a column temperature: 140° C., a detector: differential refractive index meter, and a mobile phase: o-dichlorobenzene. The molecular weight was constituted using standard polystyrene.

In addition, the ionization potentials of the polythiophenes 1 to 14 were measured using the following method.

[Production of Polythiophene Film]

1 mL of a THF-xylene (7:3) solution was added to 10 mg of polythiophene, and was dissolved using an ultrasonic washer "US-2" (manufactured by Iuchi Seieido Co., Ltd., output 120 W, indirect radiation). Meanwhile, as the substrate, a 40 mm×50 mm glass substrate having a thickness of 1.1 mm was ultrasonic-washed in acetone, and then a UV-ozone treatment was carried out for 10 minutes. The THF-xylene solution of the polythiophene was applied onto the glass substrate through spin coating (2000 rpm, for 30 seconds), and then dried at room temperature, thereby producing a polythiophene film. The ionization potential of the obtained polythiophene film was measured and evaluated using the following method.

[Measurement of Ionization Potential]

The ionization potential of the polythiophene was measured through photoelectric spectrometry in the atmosphere using a photoelectric spectrometer "AC-2" (manufactured by Riken Keiki Co., Ltd.). A positive great value of the ionization potential indicates a state in which the conjugate system of the main chain of the polythiophene macromolecule is cut, and thus the macromolecule main chain is significantly twisted.

Example 1-1

10 mL of o-dichlorobenzene was added to 10 mg of ASP-100F (manufactured by Hanwha Nanotech Corporation, purity 95%) as a single-layer carbon nanotube and 25 mg of the polythiophene 1, and the components were stirred for 20 minutes using a mechanical stirrer. After that, the components were ultrasonic-dispersed at 30° C. for 40 minutes using an ultrasonic washer "US-2" (manufactured by Iuchi Seieido Co., Ltd., output 120 W, indirect radiation), thereby producing an o-dichlorobenzene solution for the thermoelectric conversion material. Meanwhile, as the substrate, a 40 mm×50 mm glass substrate having a thickness of 1.1 mm was ultrasonic-washed in acetone, and then a UV-ozone treatment was carried out for 10 minutes. The o-dichlorobenzene solution of the thermoelectric conversion material was applied onto the glass substrate through spin coating (1500 rpm, for 30 seconds), and then dried for three hours under conditions of at room temperature in a vacuum, thereby forming a thermoelectric conversion layer having a thickness of approximately 50 nm.

The electric conductivity and CNT-dispersing properties of the obtained thermoelectric conversion layer were measured and evaluated using the following methods. The results are described in Table 1.

[Measurement of Electric Conductivity]

The electric conductivity of the formed thermoelectric conversion layer was obtained by measuring the surface resistivity (unit: Ω/□) using a "high resistivity meter: HIRESTA UP" or a "low resistivity meter: LORESTA GP" (both manufactured by Mitsubishi Chemical Analytech Co., Ltd.), measuring the film thickness using a contact-type thickness meter (unit: cm), and computing the electric conductivity (S/cm) using the following equation.

(Electric conductivity)=1/((surface resistivity)×(film thickness))

[CNT-Dispersing Properties]

The CNT-dispersing properties were visually evaluated on the basis of the following three standards.

1: The time necessary to disperse the CNT is shorter than 5 minutes.

2: The time necessary to disperse the CNT is in a range of 5 minutes to shorter than 15 minutes.

3: The time necessary to disperse the CNT is 15 minutes or longer.

Examples 1-2 to 1-7

Thermoelectric conversion layers were formed and evaluated in the same manner as in Example 1-1 except for the fact that the types of the polythiophene were changed as described in Table 1 in Example 1-1. The results are described in Table 1.

Example 1-8

A thermoelectric conversion layer was formed and evaluated in the same manner as in Example 1-1 except for the fact that 0.5 mg of ASP-100F (manufactured by Hanwha Nanotech Corporation, purity 95%) as the single-layer carbon nanotube and 34.5 mg of the polythiophene 1 were used in Example 1-1.

Comparative Examples 1-1 to 1-4

Thermoelectric conversion layers were formed and evaluated in the same manner as in Example 1-1 except for the fact that the types of the polythiophene were changed as described in Table 1 in Example 1-1. The results are described in Table 1.

Comparative Example 1-5

A thermoelectric conversion layer was formed and evaluated in the same manner as in Example 1-1 except for the fact that 0.5 mg of ASP-100F (manufactured by Hanwha Nanotech Corporation, purity 95%) as the single-layer carbon nanotube and 34.5 mg of the polythiophene 11 were used in Example 1-1.

TABLE 1

| | Polythiophene | Ionization potential eV | Electric conductivity σ S/cm | CNT-dispersing properties |
|---|---|---|---|---|
| Example 1-1 | 1 | 5.5 | 312 | 2 |
| Example 1-2 | 2 | 5.5 | 292 | 2 |
| Example 1-3 | 3 | 5.5 | 203 | 2 |
| Example 1-4 | 4 | 5.5 | 185 | 1 |
| Example 1-5 | 5 | 5.5 | 173 | 1 |
| Example 1-6 | 6 | 5.5 | 145 | 1 |
| Example 1-7 | 7 | 5.5 | 102 | 2 |
| Example 1-8 | 1 | 5.5 | 98 | 2 |
| Comparative Example 1-1 | 11 | 5.2 | 51 | 3 |
| Comparative Example 1-2 | 12 | 5.2 | 31 | 3 |
| Comparative Example 1-3 | 13 | 5.2 | 3 | 3 |
| Comparative Example 1-4 | 14 | 5.2 | 5 | 1 |
| Comparative Example 1-5 | 11 | 5.2 | $10^{-4}$ | 3 |

As is clear from Table 1, in Examples 1-1 to 1-8 in which the thermoelectric conversion material including the polythiophene polymer, in which both the third and fourth positions of the thiophene ring were substituted by alkyl groups, and the CNT was used, the main chain of the polythiophene polymer was significantly twisted, a high electric conductivity and favorable CNT-dispersing properties were exhibited, and the number of defects in the CNT was small. Furthermore, in Examples 1-1 to 1-7 in which the content of the CNT in the total solid content of the thermoelectric conversion material was in a range of 2 mass % to 60 mass %, and the content of the polythiophene polymer was in a range of 20 mass % to 80 mass %, a higher electric conductivity was exhibited than in Example 1-8. In addition, in Examples 1-4 to 1-6 in which the polythiophene in which one of the substituents in the thiophene ring was a branched alkyl group, the CNT-dispersing properties further improved.

On the contrary, in Comparative Examples 1-1 to 1-5 in which the polythiophene, in which any one of the third and fourth positions of the thiophene ring was a hydrogen atom, was used, the polymer main chain was slightly twisted, and the electric conductivity was significantly decreased. Furthermore, in Comparative Example 1-5 in which the content of the CNT in the total solid content of the thermoelectric conversion material was less than 2 mass %, and the content of the polythiophene polymer exceeded 80 mass %, the electric conductivity and the dispersibility were significantly degraded.

Example 2-1

A mold frame was produced on a glass substrate using a 300 μm-thick NITOFLON No. 901UL (manufactured by Nitto Denko Corporation) and a two-sided adhesive film. The o-dichlorobenzene solution of the thermoelectric conversion material manufactured in the same manner as in Example 1-1 was made to flow into the mold frame, was dried at room temperature, then, an annealing treatment was carried out for 10 minutes on a hot plate having a temperature of 80° C., and the mold frame was peeled off, thereby forming a 2.0 μm-thick thermoelectric conversion layer, and producing a thermoelectric conversion element.

The electric conductivity, thermoelectric conversion characteristics, and film-forming properties of the obtained thermoelectric conversion element were measured and evaluated using the following methods. The results are described in Table 2.

[Evaluation of Electric Conductivity and Thermoelectric Conversion Characteristics]

The Seebeck coefficient (V/K) and the electric conductivity (S/cm) were measured at a temperature of 100° C. in the atmosphere using a thermoelectric conversion characteristic measurement machine MODEL RZ2001i (manufactured by Ozawa Science Co., Ltd.). From the obtained Seebeck coefficient and electric conductivity, a power factor (PF) was computed using the following equation as the thermoelectric conversion characteristic.

PF=(Seebeck coefficient)$^2$×(electric conductivity)

[Evaluation of Film-Forming Properties]

The film-forming properties were evaluated on the basis of the following two standards by visually observing the thermoelectric conversion layer.

1: Aggregates are rarely observed, and the film-forming properties were favorable.

2: A small number of aggregates were observed, and the film-forming properties were degraded.

Examples 2-2 to 2-7

Thermoelectric conversion elements were produced and evaluated in the same manner as in Example 2-1 except for the fact that the o-dichlorobenzene solution of the thermoelectric conversion material produced in the same manner as in Examples 1-2 to 1-7 was used as the thermoelectric conversion material in Example 2-1.

Comparative Examples 2-1 to 2-4

Thermoelectric conversion elements were produced and evaluated in the same manner as in Example 2-1 except for the fact that the o-dichlorobenzene solution of the thermoelectric conversion material produced in the same manner as in Comparative Examples 1-1 to 1-4 was used as the thermoelectric conversion material in Example 2-1.

TABLE 2

| | Polythiophene | Electric conductivity σ S/cm | Thermoelectric conversion characteristics (PF) μW/(m·K) | Film-forming properties |
|---|---|---|---|---|
| Example 2-1 | 1 | 389 | 53.3 | 2 |
| Example 2-2 | 2 | 199 | 28.7 | 2 |
| Example 2-3 | 3 | 302 | 43.6 | 2 |
| Example 2-4 | 4 | 201 | 15.3 | 1 |
| Example 2-5 | 5 | 182 | 17.0 | 1 |
| Example 2-6 | 6 | 150 | 15.0 | 1 |
| Example 2-7 | 7 | 132 | 12.5 | 2 |
| Comparative Example 2-1 | 11 | 17 | 7.9 | 2 |
| Comparative Example 2-2 | 12 | 30 | 0.16 | 2 |
| Comparative Example 2-3 | 13 | 3.2 | 0.66 | 2 |
| Comparative Example 2-4 | 14 | 6.2 | 0.23 | 2 |

As is clear from Table 2, in Examples 2-1 to 2-7 in which the thermoelectric conversion material including the polythiophene polymer, in which both the third and fourth positions of the thiophene ring were substituted by alkyl groups, and the CNT was used, high electric conductivity and thermoelectric conversion characteristics (PF values) were exhibited, and the film-forming properties were also excellent. Particularly, in Examples 2-4 to 2-6 in which the polythiophene, in which one of the substituents in the thiophene ring was a branched alkyl group, was used, the film-forming properties further improved.

On the contrary, in Comparative Examples 2-1 to 2-4 in which the polythiophene, in which any one of the third and fourth positions of the thiophene ring was a hydrogen atom, was used, both the electric conductivity and the electric conversion characteristics were poor.

Example 3-1

1. Production of Carbon Nanotube-Dispersed Paste 40 ml of o-dichlorobenzene was added to 720 mg of the polythiophene 2 (manufactured by American Dye Source, Inc.), thereby producing a polythiophene solution 3-1 using an ultrasonic washer "US-2" (manufactured by Iuchi Seieido Co., Ltd., output 120 W, indirect radiation) under conditions of 40° C. for 10 minutes.

Next, 960 mg of ASP-100F (manufactured by Hanwha Nanotech Corporation, purity 95%) was added to the solution 3-1 as a single-layer carbon nanotube, was ultrasonic-dispersed at 30° C. for 30 minutes using an ultrasonic homogenizer VC-750 (manufactured by Sonics & Materials Inc., taper microchip (having a probe diameter of 6.5 mm) was used, output 50 W, direction radiation, duty ratio 50%), and furthermore, was ultrasonic-dispersed at 30° C. for 60 minutes using an ultrasonic washer "US-2" (manufactured by Iuchi Seieido Co., Ltd., output 120 W, indirect radiation), thereby producing carbon nanotube-dispersed solution 3-1.

Next, 1.68 g of polystyrene (manufactured by Wako Pure Chemical Industries, Ltd.) having a polymerization degree of 2,000 was added to the dispersed solution 3-1 as the non-conjugated macromolecule, was dissolved in a 50° C. hot bath, and then was stirred for 15 minutes at a rotation speed of 2000 rpm using a planetary centrifugal mixer ARE-250 (manufactured by Thinky Corporation), thereby producing carbon nanotube-dispersed paste 3-1. The content ratio of the CNT to the solid content of the paste was 28.6 mass %, and the content ratio of the polythiophene was 21.4 mass %. The CNT-dispersing properties of the dispersed paste 3-1 were evaluated.

2. Production of Thermoelectric Conversion Layer

A film was formed on a substrate using the above-prepared carbon nanotube-dispersed paste 3-1, thereby forming a thermoelectric conversion layer.

In detail, after ultrasonic washing in isopropyl alcohol, a 2 mm-thick metal mask having a 13 mm×13 mm opening section formed by a laser process was placed on a 1.1 mm-thick glass substrate which had been subjected to a UV-ozone treatment for 10 minutes. Next, the above-prepared carbon nanotube-dispersed paste 3-1 was injected through the opening section, then, the metal mask was removed, and subsequently, the glass substrate was heated and dried on an 80° C. hot plate, thereby producing a thermoelectric conversion layer 3-1. The film-forming properties, electric conductivity, and thermoelectric conversion characteristics of the thermoelectric conversion layer were evaluated.

3. Production of Thermoelectric Conversion Element

Figure 3:
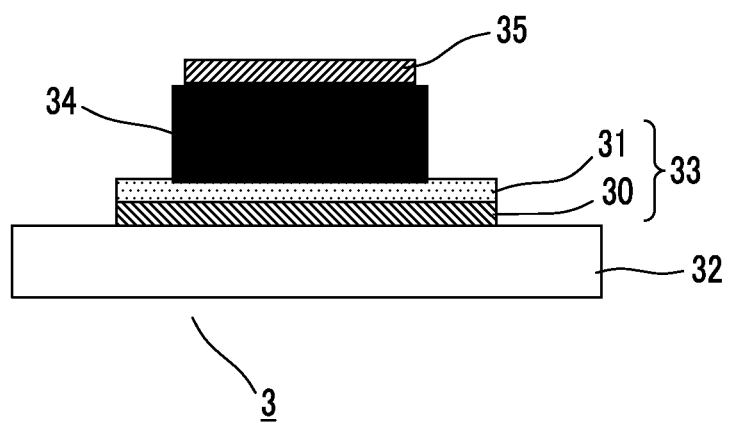
FIG. 3 is a schematic view of a thermoelectric conversion element produced in an example.

A thermoelectric conversion element illustrated in FIG. 3 was produced using the above-prepared carbon nanotube-dispersed paste 3-1.

In detail, after ultrasonic washing in isopropyl alcohol, a 100 nm-thick chromium layer and then a 200 nm-thick gold layer (30 and 31) were laminated through an ion plating method on a 40 mm×50 mm glass substrate (32) having a thickness of 1.1 mm using a metal mask having a 20 mm×20 mm opening section formed by etching, thereby forming an electrode 1 (33).

Next, the above-prepared carbon nanotube-dispersed paste 3-1 was injected using the 2 mm-thick metal mask having a 13 mm×13 mm opening section formed by a laser process, and then the glass substrate was heated and dried on an 80° C. hot plate, thereby producing a thermoelectric conversion layer 3-1 (34) on the electrode 1.

Next, a conductive paste DOTITE D-550 (manufactured by Fujikura Kasei Co., Ltd., silver paste) was applied using a screen printing method so as to form an electrode 2 (35) on the thermoelectric conversion layer 3-1, a thermoelectric conversion element 3-1 (3) was produced, and the thermoelectric force thereof was evaluated.

4. Test Method

[CNT Dispersing Properties]

The CNT-dispersing properties were evaluated using the following four standards by dropping the carbon nanotube-dispersed paste onto a glass slide, placing a glass cover over thereon, and then visually observing the paste.

1: No black aggregates were observed.
2: Black aggregates having a size of less than 0.5 mm were observed.
3: Black aggregates having a size in a range of 0.5 mm to less than 1 mm were observed.
4: Black aggregates exceeding Standard 3 were observed.

[Film-Forming Properties]

The film-forming properties were evaluated using the following three standards on the basis of the visual observation.

1: The size of the thermoelectric conversion layer is 1.5 times or less the opening section in the metal mask.
2: The size of the thermoelectric conversion layer is more than 1.5 times to 2.0 times the opening section in the metal mask.
3: The size of the thermoelectric conversion layer is more than 2.0 times the opening section in the metal mask.

[Electric Conductivity]

The electric conductivity was evaluated in the same manner as in Example 2-1.

[Thermoelectric Conversion Characteristics (PF)]

Relative values with respect to Comparative Example 3-1 described below were evaluated on the basis of the power factor (PF value) computed in the same manner as in Example 2-1.

[Thermoelectric Force]

For the thermoelectric force of the thermoelectric conversion element, the voltage difference caused between the electrode 1 and the electrode 2 when the glass substrate in the thermoelectric conversion element was heated on the hot plate having a surface temperature of 80° C. was measured using a digital multi-meter R6581 (manufactured by Advantest Corporation).

Relative values with respect to Comparative Example 3-1 described below were evaluated on the basis of the measured values.

Examples 3-2 and 3-3

Thermoelectric conversion layers and thermoelectric conversion elements were produced in the same manner as in Example 3-1 except for the fact that the polythiophene 2 was changed to the same amount of the polythiophene 4 or 5 in Example 3-1, and the characteristics thereof were evaluated.

Comparative Example 3-1

A thermoelectric conversion layer and a thermoelectric conversion element for comparison were produced in the same manner as in Example 3-1 except for the fact that the polythiophene 2 was changed to the same amount of the polythiophene 12 in Example 3-1, and the characteristics thereof were evaluated.

The evaluation results are described in Table 3.

TABLE 3

| | Polythiophene | Non-conjugated macromolecule | CNT-dispersing properties | Film-forming properties | Electric conductivity S/cm | PF (relative value) | Thermoelectric force (relative value) |
|---|---|---|---|---|---|---|---|
| Example 3-1 | 2 | Polystyrene | 2 | 2 | 204 | 3.1 | 1.3 |
| Example 3-2 | 4 | Polystyrene | 1 | 1 | 142 | 2.2 | 1.5 |
| Example 3-3 | 5 | Polystyrene | 1 | 1 | 135 | 2.1 | 1.4 |
| Comparative Example 3-1 | 12 | Polystyrene | 2 | 3 | 54 | 1 | 1 |

* PF and the thermoelectric forces were evaluated using the relative values with respect to Comparative Example 3-1.

As is clear from Table 3, in Examples 3-1 to 3-3 including the thermoelectric conversion layer including the polythiophene polymer, in which both the third and fourth positions of the thiophene ring were substituted by alkyl groups, the CNT, and the non-conjugated macromolecule was used, the CNT-dispersing properties and the film-forming properties were excellent, and the electric conductivity, thermoelectric conversion characteristics (PF), and thermoelectric force were also excellent. In addition, in Examples 3-2 and 3-3 in which the polythiophene, in which one of the substituents in the thiophene ring was a branched alkyl group, was used, the CNT-dispersing properties further improved.

On the contrary, in Comparative Example 3-1 in which the polythiophene, in which any one of the third and fourth positions of the thiophene ring was a hydrogen atom, was used, the electric conductivity was low.

Example 4-1

30 ml of o-dichlorobenzene was added to 360 mg of the polythiophene 2, thereby producing a polythiophene solution 4-1 using an ultrasonic washer "US-2" (manufactured by Iuchi Seieido Co., Ltd., output 120 W, indirect radiation).

Next, 480 mg of KH SWCNT HP (manufactured by KH Chemicals Co., Ltd., purity 80%) was added to the solution 4-1 as a single-layer carbon nanotube, was ultrasonic-dispersed at 30° C. for 30 minutes using an ultrasonic homogenizer VC-750 (manufactured by Sonics & Materials Inc., taper microchip (having a probe diameter of 6.5 mm) was used, output 50 W, direction radiation, duty ratio 50%), thereby producing a carbon nanotube-dispersed solution 4-1.

Next, 0.86 g of poly(2-vinyl naphthalene) (weight-average molecular weight 175,000, manufactured by Sigma-Aldrich Japan K.K.) was added to the dispersed solution 4-1 as the non-conjugated macromolecule, was dissolved in a 50° C. hot bath, and then was stirred for 15 minutes at a rotation speed of 2200 rpm using a planetary centrifugal mixer ARE-250 (manufactured by Thinky Corporation), thereby producing a carbon nanotube-dispersed paste precursor 4-1.

Furthermore, the precursor 4-1 was reciprocated 15 times under a rotation ratio condition of 1:1.7:2.9 using a triple roll mill BR-100V (manufactured by Aimex Co., Ltd.), thereby preparing carbon nanotube-dispersed paste 4-1.

The content ratio of the CNT in the solid content of the paste was 28.2 mass %, and the content ratio of the polythiophene was 21.1 mass %. The CNT-dispersing properties of the dispersed paste 4-1 were evaluated in the same manner as in Example 3-1.

Example 4-2

Carbon nanotube-dispersed paste 4-2 was produced in the same manner as in Example 4-1 except for the fact that the same amount of the polythiophene 4 was used instead of the polythiophene 2.

Example 4-3

Carbon nanotube-dispersed paste 4-3 was produced in the same manner as in Example 4-2 except for the fact that the same amount of PC-Z-type polycarbonate (manufactured by Teijin Chemicals Ltd., trade name "PANLITE TS-2020") was used instead of poly(2-vinyl naphthalene) in Example 4-2.

Thermoelectric conversion layers and thermoelectric conversion elements were produced in the same manner as in Example 3-1 except for the fact that the carbon nanotube-dispersed paste 3-1 was changed to each of the pastes 4-1 to 4-3 produced above in Example 3-1, and the characteristics thereof were evaluated in the same manner as in Example 3-1. The results are described in Table 4.

TABLE 4

| | Polythiophene | Non-conjugated macromolecule | CNT-dispersing properties | Film-forming properties | Electric conductivity S/cm | PF (relative value) | Thermoelectric force (relative value) |
|---|---|---|---|---|---|---|---|
| Example 4-1 | 2 | Poly(2-vinylnaphthalene) | 2 | 2 | 121 | 2.8 | 1.3 |
| Example 4-2 | 4 | Poly(2-vinylnaphthalene) | 2 | 1 | 85 | 2.1 | 1.5 |
| Example 4-3 | 4 | Polycarbonate | 1 | 1 | 79 | 2.2 | 1.5 |

* PF and the thermoelectric forces were evaluated using the relative values with respect to Comparative Example 3-1.

As is clear from Table 4, in Examples 4-1 to 4-3 including the thermoelectric conversion layer including the polythiophene polymer, in which both the third and fourth positions of the thiophene ring were substituted by alkyl groups, the CNT, and the non-conjugated macromolecule was used, the CNT-dispersing properties and the film-forming properties were excellent, and the electric conductivity, thermoelectric conversion characteristics (PF), and thermoelectric force were also excellent. In addition, in Examples 4-2 and 4-3 in which the polythiophene, in which one of the substituents in the thiophene ring was a branched alkyl group, was used, the CNT-dispersing properties or the film-forming properties further improved.

Example 5-1

A thermoelectric conversion element was produced using a polyethylene terephthalate (hereinafter, PET) film produced below as a substrate.

1. Production of Supporting Body

A PET resin that had been polycondensed using Ge as a catalyst was dried to a water content ratio of 50 ppm or less, the heater temperature was set in a range of 280° C. to 300° C., and the PET resin was molten in an extruder. The molten PET resin was discharged onto an electrostatically-applied chill roll from a die unit, thereby obtaining an amorphous base. The obtained amorphous base was stretched 3.3 times in the base-advancing direction, and then was stretched 3.8 times with respect to the width direction, thereby obtaining a 188 μm-thick supporting body.

2. Formation of Adhesive Layer

After a corona discharge treatment was carried out on both surfaces of the obtained supporting body under a condition of 730 J/m$^2$, a coating fluid A for an adhesive layer having the following composition was applied to both surfaces using a bar coating method at an application amount of 4.4 cm$^3$/m$^2$. In addition, the coating fluid-applied surfaces were dried at 160° C. for one minute so as to form an adhesive layer, thereby obtaining a laminate sheet (conductor) including the adhesive layer formed on both surfaces of the supporting body.

Composition of Coating Fluid A for Adhesive Layer

| | |
|---|---|
| Urethane resin binder (manufactured by Mitsui Chemicals, Inc., OLESTER UD350, solid content of 38 mass %, glass transition temperature of 33° C.) | 30.7 parts by mass |
| Acryl resin binder (manufactured by Daicel FineChem Ltd., AS563, solid content of 27.5 mass %, glass transition temperature of 47° C.) | 4.2 parts by mass |
| Crosslinking agent (manufactured by Nisshinbo Holdings Inc., CARBODILITE V-02-L2, solid content of 40 mass %) | 5.8 parts by mass |
| Additive (filler) (manufactured by Nippon Aerosil Co., Ltd., AEROSIL OX-50, solid content of 10 mass %) | 1.9 parts by mass |
| Additive (filler) (manufactured by Nissan Chemical Industries, Ltd. SNOTEX XL, solid content of 40 mass %) | 0.8 parts by mass |
| Additive (sliding agent) (manufactured by Chukyo Yushi Co, Ltd., SELOSOL 524, solid content of 30 mass %) | 1.9 parts by mass |
| Surfactant 1 (manufactured by NOF Corporation, RAPISOL B-90, anionic 1 mass %) | 15.5 parts by mass |
| Surfactant 2 (manufactured by Sanyo Chemical Industries, Ltd., NARO ACTY CL-95, nonionic 1 mass %) | 19.4 parts by mass |
| Pure water | added so that the total reached 1000 parts by mass |

3. Production of Carbon Nanotube-Dispersed Paste

Carbon nanotube-dispersed paste 5-1 was produced in the same manner as in Example 4-1 except for the fact that the same amount of polystyrene having a polymerization degree of 2,000 (manufactured by Wako Pure Chemical Industries, Ltd.) was used instead of poly(2-vinyl naphthalene) in Example 4-1.

4. Production of Thermoelectric Conversion Element

A 100 nm-thick chromium layer and then a 200 nm-thick gold layer were formed and laminated through an ion plating method on a 40 mm×50 mm laminate sheet using a metal mask having a 20 mm×20 mm opening section formed by etching, thereby forming an electrode 1.

Next, the above-prepared carbon nanotube-dispersed paste 5-1 was injected using the 2 mm-thick metal mask having a 13 mm×13 mm opening section formed by a laser process, and then the film substrate was heated and dried on an 80° C. hot plate, thereby producing a thermoelectric conversion layer 5-1 on the electrode 1.

Next, a conductive paste DOTITE D-550 (manufactured by Fujikura Kasei Co., Ltd., silver paste) was applied using a screen printing method so as to form an electrode 2 on the thermoelectric conversion layer 5-1, thereby producing a thermoelectric conversion element 5-1.

As a result of measuring the voltage difference caused between the electrode 1 and the electrode 2 when the film substrate in the thermoelectric conversion element was heated on the hot plate having a surface temperature of 80° C. using a digital multi-meter R6581 (manufactured by Advantest Corporation), it was confirmed that a voltage difference was caused.

Example 5-2

Carbon nanotube-dispersed paste 5-2 was produced in the same manner as in Example 5-1 except for the fact that the same amount of polythiophene 4 was used instead of the polythiophene 2 in Example 5-1. Subsequently, a thermoelectric conversion layer and a thermoelectric conversion element 5-2 were produced in the same manner as in Example 5-1 except for the fact that the carbon nanotube-dispersed paste 5-2 was used instead of the carbon nanotube-dispersed paste 5-1.

As a result of measuring the voltage difference caused between the electrode 1 and the electrode 2 when the film substrate in the thermoelectric conversion element was heated on the hot plate having a surface temperature of 80° C. using a digital multi-meter R6581 (manufactured by Advantest Corporation), it was confirmed that a voltage difference was caused.

Example 6-1

An o-dichlorobenzene solution of the thermoelectric conversion material was produced in the same manner as in Example 1-1. An 8 mm×8 mm pattern was printed on a glass substrate using this solution and the ink jet printer. An ink jet printer DMP-2831 manufactured by Fujifilm Dynamics was used as the ink jet printer, and the solution was discharged onto the glass substrate in an amount of 10 pl of liquid droplets per nozzle, thereby forming the pattern. At this time, the inside of the printer was heated so that the temperature of the discharged solution reached 40° C.

After the formation of the pattern, the solvent was distilled away by heating the pattern at 120° C. for 15 minutes, furthermore, ink jet printing was repeatedly carried out, and a 2.0 μm-thick thermoelectric conversion layer was formed, thereby producing a thermoelectric conversion element.

The thermoelectric conversion characteristics of the obtained thermoelectric conversion element were evaluated in the same manner as in Example 2-1.

Examples 6-2 to 6-7

Thermoelectric conversion elements were produced in the same manner as in Example 6-1 except for the fact that the o-dichlorobenzene solution of the thermoelectric conversion material was changed to the o-dichlorobenzene solution of the thermoelectric conversion material produced in Examples 1-2 to 1-7 in Example 6-1, and were evaluated in the same manner as in Example 6-1.

The thermoelectric characteristic values of Examples 6-1 to 6-7 and the thermoelectric characteristic values of Examples 2-1 to 2-7 are described side by side in Table 5.

TABLE 5

| | Polythiophene | Thermoelectric performance (PF) $\mu W/(m \cdot K)$ | Film-forming method |
|---|---|---|---|
| Example 2-1 | 1 | 53.3 | Flow-in |
| Example 6-1 | 1 | 74.6 | Ink jet method |
| Example 2-2 | 2 | 28.7 | Flow-in |
| Example 6-2 | 2 | 38.8 | Ink jet method |
| Example 2-3 | 3 | 43.6 | Flow-in |
| Example 6-3 | 3 | 60.5 | Ink jet method |
| Example 2-4 | 4 | 15.3 | Flow-in |
| Example 6-4 | 4 | 19.9 | Ink jet method |
| Example 2-5 | 5 | 17 | Flow-in |
| Example 6-5 | 5 | 22.8 | Ink jet method |
| Example 2-6 | 6 | 15 | Flow-in |
| Example 6-6 | 6 | 19.5 | Ink jet method |
| Example 2-7 | 7 | 12.5 | Flow-in |
| Example 6-7 | 7 | 16.3 | Ink jet method |

As is clear from Table 5, the thermoelectric conversion element in which the thermoelectric conversion layer was formed using the ink jet printing method exhibited more favorable thermoelectric conversion characteristics than the thermoelectric conversion element in which the thermoelectric conversion layer was formed by making the o-dichlorobenzene solution to flow into the mold frame even when the same o-dichlorobenzene solution of the thermoelectric conversion material was used.

What is claimed is:
1. A thermoelectric conversion material comprising:
a carbon nanotube; and
a polythiophene polymer constituted of a repeating unit represented by the following formula (1),

[Chem. 1]

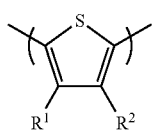

Formula (1)

in Formula (1), each of $R^1$ and $R^2$ independently represents an alkyl group having 1 to 20 carbon atoms.
2. The thermoelectric conversion material according to claim 1,
wherein, in Formula (1), $R^2$ is an alkyl group having 4 to 12 carbon atoms.
3. The thermoelectric conversion material according to claim 1,
wherein, in Formula (1), $R^1$ is an alkyl group having 1 to 4 carbon atoms.
4. The thermoelectric conversion material according to claim 2,
wherein, in Formula (1), $R^1$ is an alkyl group having 1 to 4 carbon atoms.
5. The thermoelectric conversion material according to claim 1,
wherein, in Formula (1), $R^2$ is a branched alkyl group having 4 to 12 carbon atoms.
6. The thermoelectric conversion material according to claim 1,
wherein, in Formula (1), $R^1$ is a straight alkyl group having 1 to 3 carbon atoms.
7. The thermoelectric conversion material according to claim 5,
wherein, in Formula (1), $R^1$ is a straight alkyl group having 1 to 3 carbon atoms.
8. The thermoelectric conversion material according to claim 1,
wherein, in Formula (1), $R^2$ is a 2-methyl hexyl group, a 2-ethyl hexyl group, a 2-methyloctyl group, or a 2-ethyloctyl group.
9. The thermoelectric conversion material according to claim 1,
wherein, in Formula (1), $R^2$ is a 2-ethyl hexyl group.
10. The thermoelectric conversion material according to claim 1,
wherein, in Formula (1), $R^1$ is a methyl group.
11. The thermoelectric conversion material according to claim 8,
wherein, in Formula (1), $R^1$ is a methyl group.
12. The thermoelectric conversion material according to claim 1,
wherein, in a total solid content of the thermoelectric conversion material, 2 mass % to 60 mass % of the carbon nanotube and 20 mass % to 80 mass % of the polythiophene polymer are included.
13. The thermoelectric conversion material according to claim 1, further comprising:
a non-conjugated macromolecule.
14. The thermoelectric conversion material according to claim 1, further comprising:
a solvent.
15. A thermoelectric conversion element,
wherein the thermoelectric conversion material according to claim 1 is used for a thermoelectric conversion layer.
16. The thermoelectric conversion element according to claim 15,
wherein the thermoelectric conversion layer is formed using an ink jet printing method.
17. The thermoelectric conversion element according to claim 15, comprising:
a base material; and
the thermoelectric conversion layer provided on the base material.

18. The thermoelectric conversion element according to claim 15, further comprising:
   an electrode.

19. An article for thermoelectric power generation, wherein the thermoelectric conversion element according to claim 15 is used.

20. A method for manufacturing a thermoelectric conversion element comprising:
   providing a thermoelectric conversion layer by printing the thermoelectric conversion material according to claim 1 on a base material using an ink jet printing method.

* * * * *